(12) United States Patent
Komura et al.

(10) Patent No.: US 12,364,166 B2
(45) Date of Patent: Jul. 15, 2025

(54) MAGNETIZATION ROTATIONAL ELEMENT, MAGNETORESISTANCE EFFECT ELEMENT, AND MAGNETIC MEMORY

(71) Applicant: TDK CORPORATION, Tokyo (JP)

(72) Inventors: Eiji Komura, Tokyo (JP); Yohei Shiokawa, Tokyo (JP)

(73) Assignee: TDK CORPORATION, Tokyo (JP)

(*) Notice: Subject to any disclaimer, the term of this patent is extended or adjusted under 35 U.S.C. 154(b) by 485 days.

(21) Appl. No.: 17/137,565

(22) Filed: Dec. 30, 2020

(65) Prior Publication Data

US 2021/0265560 A1 Aug. 26, 2021

(30) Foreign Application Priority Data

Feb. 20, 2020 (JP) .................................. 2020-027480

(51) Int. Cl.
  *H10N 50/80* (2023.01)
  *G11C 11/16* (2006.01)
  *H10B 61/00* (2023.01)
  *H10N 50/85* (2023.01)

(52) U.S. Cl.
  CPC ........... *H10N 50/80* (2023.02); *G11C 11/161* (2013.01); *H10B 61/22* (2023.02); *H10N 50/85* (2023.02)

(58) Field of Classification Search
  CPC ........ H10N 50/80; H10N 50/85; H10B 61/22; G11C 11/16
  See application file for complete search history.

(56) References Cited

U.S. PATENT DOCUMENTS

| | | | | |
|---|---|---|---|---|
| 7,035,138 B2* | 4/2006 | Ikeda | .................. | H01F 10/3286 365/158 |
| 8,350,347 B2 | 1/2013 | Gaudin et al. | | |
| 2008/0105878 A1* | 5/2008 | Ohara | ................. | H01L 27/1021 257/E27.005 |
| 2015/0348606 A1 | 12/2015 | Buhrman et al. | | |
| 2017/0117323 A1 | 4/2017 | Braganca et al. | | |
| 2017/0222135 A1 | 8/2017 | Fukami et al. | | |
| 2018/0375015 A1* | 12/2018 | Sasaki | ..................... | H10N 52/80 |
| 2019/0189909 A1* | 6/2019 | Sasaki | ..................... | G11C 11/18 |

(Continued)

FOREIGN PATENT DOCUMENTS

| JP | 2017-112358 A | 6/2017 |
|---|---|---|
| JP | 2017-216286 A | 12/2017 |

(Continued)

OTHER PUBLICATIONS

Y. K. Kato et al.; "Observation of the Spin Hall Effect In Semiconductors;" Science; vol. 306; Dec. 10, 2004.

(Continued)

*Primary Examiner* — Zandra V Smith
*Assistant Examiner* — Andre C Stevenson
(74) *Attorney, Agent, or Firm* — Oliff PLC

(57) ABSTRACT

This magnetization rotational element includes a spin injection region that extends in a first direction, a first ferromagnetic layer that is laminated on the spin injection region, and a metal region that is adjacent to the spin injection region with an insulator interposed therebetween in a second direction orthogonal to the first direction in a plan view in a lamination direction.

16 Claims, 14 Drawing Sheets

(56) References Cited

U.S. PATENT DOCUMENTS

2020/0106004 A1 4/2020 Komura
2021/0233577 A1* 7/2021 Saito .................. H10B 61/22

FOREIGN PATENT DOCUMENTS

JP 6551594 B1 7/2019
WO 2016/021468 A1 2/2016

OTHER PUBLICATIONS

I. M. Miron et al.; Perpendicular Switching of a Single Ferromagnetic Layer Induced by In-Plane Current Injection; Nature; vol. 476; Aug. 11, 2011.
L. Liu et al, Spin Toque Switching With the Giant Spin Hall Effect of Tantalum; Science; 2012.
L. Liu et al.; :Current-Induced Switching of Perpendicularly Magnetized Magnetic Layers Using Spin Torque from the Spin Hall Effect; Physical Review Letters; vol. 109; Aug. 31, 2012.
K. S. Lee et al.; "Threshold Current for Switching of Perpendicular Magnetic Layer Induced by Spin Hall Effect;" Applied Physics Letters; vol. 102; 2013.
K. S. Lee et al.; "Thermally Activated Switching of Perpendicular Marnet by Spin-Orbit Spin Torque;" Applied Physics Letters; vol. 104; 2014.
S. Fukami et al.; "Magnetization Switching by Spin-Orbit Torque in an Antiferromagnet-ferromagnet Bilayer System;" Nature Materials; vol. 15; 2016.
S. Fukami et al.; "A Spin-Orbit Torque Switching Scheme with Collinear Magnetic Easy Axis and Current Configuration;" Nature Nanotechnology; vol. 11; 2016.
S. Takahashi et al.; Spin Injection and Detection in Magnetic Nanostructures; Physical Review; 2003.
Y. Seo et al.; Area-Efficient SOT-MRAM With a Schottky Diode; IEEE Electron Device Letters; vol. 37; No. 8; 2016.

* cited by examiner

MAGNETIZATION ROTATIONAL ELEMENT, MAGNETORESISTANCE EFFECT ELEMENT, AND MAGNETIC MEMORY

CROSS-REFERENCE TO RELATED APPLICATION

This application is based upon and claims the benefit of priority from Japanese Patent Application No. 2020-027480, Feb. 20, 2020 the entire contents of which are incorporated herein by reference.

FIELD

The present invention relates to a magnetization rotational element, a magnetoresistance effect element, and a magnetic memory.

BACKGROUND

Giant magnetoresistance (GMR) elements constituted of a multilayer film having ferromagnetic layers and a nonmagnetic layer, and tunnel magnetoresistance (TMR) elements using an insulating layer (a tunnel barrier layer or a barrier layer) as a nonmagnetic layer are known as magnetoresistance effect elements. A magnetoresistance effect element can be applied to magnetic sensors, high-frequency components, magnetic heads, and magnetic random access memories (MRAMs).

An MRAM is a storage element in which a magnetoresistance effect element is integrated. An MRAM reads and writes data utilizing characteristics in which a resistance of a magnetoresistance effect element varies when directions of magnetization of two ferromagnetic layers having a nonmagnetic layer interposed therebetween vary in the magnetoresistance effect element. For example, directions of magnetization of ferromagnetic layers are controlled utilizing a magnetic field generated due to a current. In addition, for example, directions of magnetization of ferromagnetic layers are controlled utilizing a spin transfer torque (STT) generated when a current flows in a lamination direction of a magnetoresistance effect element.

When directions of magnetization of ferromagnetic layers are rewritten utilizing an STT, a current is caused to flow in the lamination direction of a magnetoresistance effect element. A writing current may cause deterioration in characteristics of a magnetoresistance effect element.

Recently, methods in which a current may not flow in the lamination direction of a magnetoresistance effect element at the time of writing are drawing attention. A writing method utilizing a spin-orbit torque (SOT) is one of these methods (for example, Japanese Unexamined Patent Application, First Publication No. 2017-216286). An SOT is induced by means of a spin current generated due to a spin-orbit interaction or a Rashba effect in an interface between materials of different kinds. A current for inducing an SOT in a magnetoresistance effect element flows in a direction intersecting the lamination direction of the magnetoresistance effect element. That is, there is no need to cause a current to flow in the lamination direction of the magnetoresistance effect element, and thus a long lifespan of the magnetoresistance effect element is expected.

SUMMARY OF THE INVENTION

In order to obtain a significant SOT, there is a need to use a material manifesting a significant spin-orbit interaction for a wiring. For example, it is said that heavy metals, such as Ta and W, are materials having a large spin Hall angle and manifesting a significant spin-orbit interaction. However, these heavy metals have a significant electrical resistance and may become a heat generation source. Heat generated in a wiring may deteriorate a stability of magnetization of a magnetoresistance effect element and may cause deterioration in reliability of stored data.

The present invention has been made in consideration of the foregoing circumstances, and an object thereof is to provide a magnetization rotational element, a magnetoresistance effect element, and a magnetic memory capable of enhancing reliability of data.

In order to resolve the foregoing problem, the present invention provides the following means.

(1) According to a first aspect, a magnetization rotational element is provided including a spin injection region that extends in a first direction, a first ferromagnetic layer that is laminated on the spin injection region, and a metal region that is adjacent to the spin injection region with an insulator interposed therebetween in a second direction orthogonal to the first direction in a plan view in a lamination direction.

(2) The magnetization rotational element according to the foregoing aspect may further include a connection region that connects the spin injection region and the metal region.

(3) In the magnetization rotational element according to the foregoing aspect, a closest distance between the spin injection region and the metal region may be shorter than a distance between a first end of the spin injection region and a middle point between the first end and a geometrical center of the first ferromagnetic layer.

(4) In the magnetization rotational element according to the foregoing aspect, a closest distance between the spin injection region and the metal region may be shorter than a length of the spin injection region in the second direction.

(5) In the magnetization rotational element according to the foregoing aspect, a distance between a first end of the spin injection region and a geometrical center of the first ferromagnetic layer may be longer than a length of the connection region in a width direction.

(6) In the magnetization rotational element according to the foregoing aspect, a distance between the spin injection region and the metal region at the first end of the spin injection region may differ from a distance between the spin injection region and the metal region at a second end of the spin injection region.

(7) In the magnetization rotational element according to the foregoing aspect, the spin injection region may include at least one selected from the group consisting of Ta, W, Pt, Au, Nb, Mo, Ru, Os, Rh, Ir, Pd, and Ag.

(8) In the magnetization rotational element according to the foregoing aspect, the insulator may be AlN or MgO.

(9) In the magnetization rotational element according to the foregoing aspect, the metal region may come into contact with a conductive part applying a current to the spin injection region.

(10) In the magnetization rotational element according to the foregoing aspect, the metal region may not come into contact with a conductive part applying a current to the spin injection region.

(11) In the magnetization rotational element according to the foregoing aspect, a thickness of the metal region may be thinner than a thickness of the spin injection region.

(12) In the magnetization rotational element according to the foregoing aspect, the metal region may not be at a position of the first ferromagnetic layer in the second direction.

(13) According to a second aspect, there is provided a magnetoresistance effect element including the magnetization rotational element according to the foregoing aspect, and a nonmagnetic layer and a second ferromagnetic layer that are laminated on the first ferromagnetic layer.

(14) According to a third aspect, there is provided a magnetic memory including a plurality of magnetoresistance effect elements according to the aspect.

The magnetization rotational element, the magnetoresistance effect element, and the magnetic memory according to the present embodiment have high reliability of data.

DETAILED DESCRIPTION OF THE INVENTION

Hereinafter, the present embodiment will be described in detail suitably with reference to the drawings. In drawings used in the following description, in order to make characteristics easy to understand, characteristic portions may be illustrated in an enlarged manner for the sake of convenience, and dimensional ratios or the like of each constituent element may differ from actual values thereof. Exemplary materials, dimensions, and the like illustrated in the following description are merely examples. The present invention is not limited thereto and can be suitably changed and performed in a range in which the effects of the present invention are exhibited.

First, directions will be defined. One direction on a surface of a substrate Sub (refer to FIG. 2) which will be described below will be referred to as an x direction, and a direction orthogonal to the x direction will be referred to as a y direction. For example, the x direction is a direction toward a conductive part 52 from a conductive part 51. A z direction is a direction orthogonal to the x direction and the y direction. The z direction is an example of a lamination direction. Hereinafter, a positive z direction may be expressed as "upward", and a negative z direction may be expressed as "downward". Upward and downward directions do not necessarily coincide with a direction in which gravity is applied.

For example, in this specification, the expression "extending in the x direction" denotes that a length in the x direction is larger than a smallest length of each of the length in the x direction, the y direction, and the z direction. The same applies to the case of extending in other directions. In addition, in this specification, the term "connect" is not limited to a case of being physically connected. For example, the term "connect" is not limited to a case in which two layers physically come into contact with each other and also includes a case in which two layers are connected to each other with another layer interposed therebetween. In addition, the term "connect" also includes a case in which two members are electrically connected to each other.

First Embodiment

Figure 1:
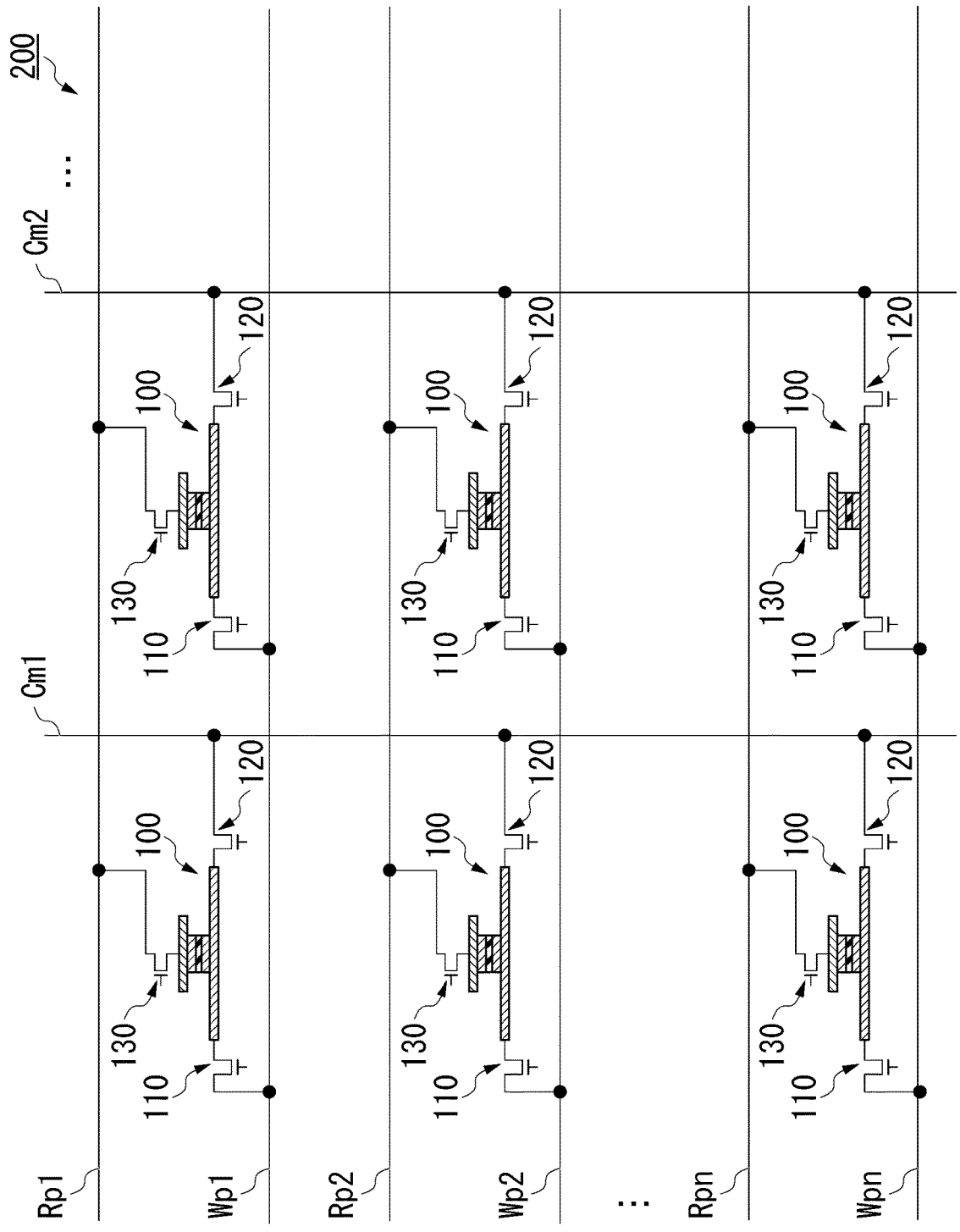
FIG. 1 is a schematic view of a magnetic recording array according to a first embodiment.

FIG. 1 is a view of a constitution of a magnetic recording array 200 according to a first embodiment. The magnetic recording array 200 includes a plurality of magnetoresistance effect elements 100, a plurality of writing wirings Wp1 to Wpn, a plurality of common wirings Cm1 to Cmn, a plurality of reading wirings Rp1 to Rpn, a plurality of first switching elements 110, a plurality of second switching elements 120, and a plurality of third switching elements 130. For example, the magnetic recording array 200 can be utilized for a magnetic memory and the like.

The writing wirings Wp1 to Wpn electrically connect a power source and one or more magnetoresistance effect elements 100 to each other. The common wirings Cm1 to Cmn are wirings used at times of both writing and reading data. The common wirings Cm1 to Cmn electrically connect a reference electric potential and one or more magnetoresistance effect elements 100 to each other. For example, the reference electric potential is the ground potential. The common wirings Cm1 to Cmn may be provided in each of the plurality of magnetoresistance effect elements 100 or may be provided over the plurality of magnetoresistance effect elements 100. The reading wirings Rp1 to Rpn electrically connect the power source and one or more magnetoresistance effect elements 100 to each other. The power source is connected to the magnetic recording array 200 when in use.

The first switching elements 110, the second switching elements 120, and the third switching elements 130 illustrated in FIG. 1 are connected to the respective magnetoresistance effect elements 100. The first switching elements 110 are connected to a portion between the magnetoresistance effect elements 100 and the writing wirings Wp1 to Wpn. The second switching elements 120 are connected to a portion between the magnetoresistance effect elements 100 and the common wirings Cm1 to Cmn. The third switching elements 130 are connected to a portion between the magnetoresistance effect elements 100 and the reading wirings Rp1 to Rpn.

When the first switching elements 110 and the second switching elements 120 are turned on, a writing current flows between the writing wirings Wp1 to Wpn and the common wirings Cm1 to Cmn connected to predetermined magnetoresistance effect elements 100. When the second switching elements 120 and the third switching elements 130 are turned on, a reading current flows between the common wirings Cm1 to Cmn and the reading wirings Rp1 to Rpn connected to predetermined magnetoresistance effect elements 100.

The first switching elements 110, the second switching elements 120, and the third switching elements 130 are elements for controlling a flow of a current. For example, the first switching elements 110, the second switching elements 120, and the third switching elements 130 are elements such as transistors or ovonic threshold switches (OTSs) utilizing phase change in a crystal layer, elements such as metal insulator transfer (MIT) switches utilizing variation in a band structure, elements such as Zener diodes and avalanche diodes utilizing a breakdown voltage, or elements of which conductivity varies in accordance with variation in atom positions.

Any of the first switching elements 110, the second switching elements 120, and the third switching elements 130 may be shared by the magnetoresistance effect element 100 connected to the same wiring. For example, when the first switching elements 110 are shared, one first switching element 110 is provided on an upstream side of the writing wirings Wp1 to Wpn. For example, when the second switching elements 120 are shared, one second switching element 120 is provided on an upstream side of the common wirings Cm1 to Cmn. For example, when the third switching elements 130 are shared, one third switching element 130 is provided on an upstream side of the reading wirings Rp1 to Rpn.

Figure 2:
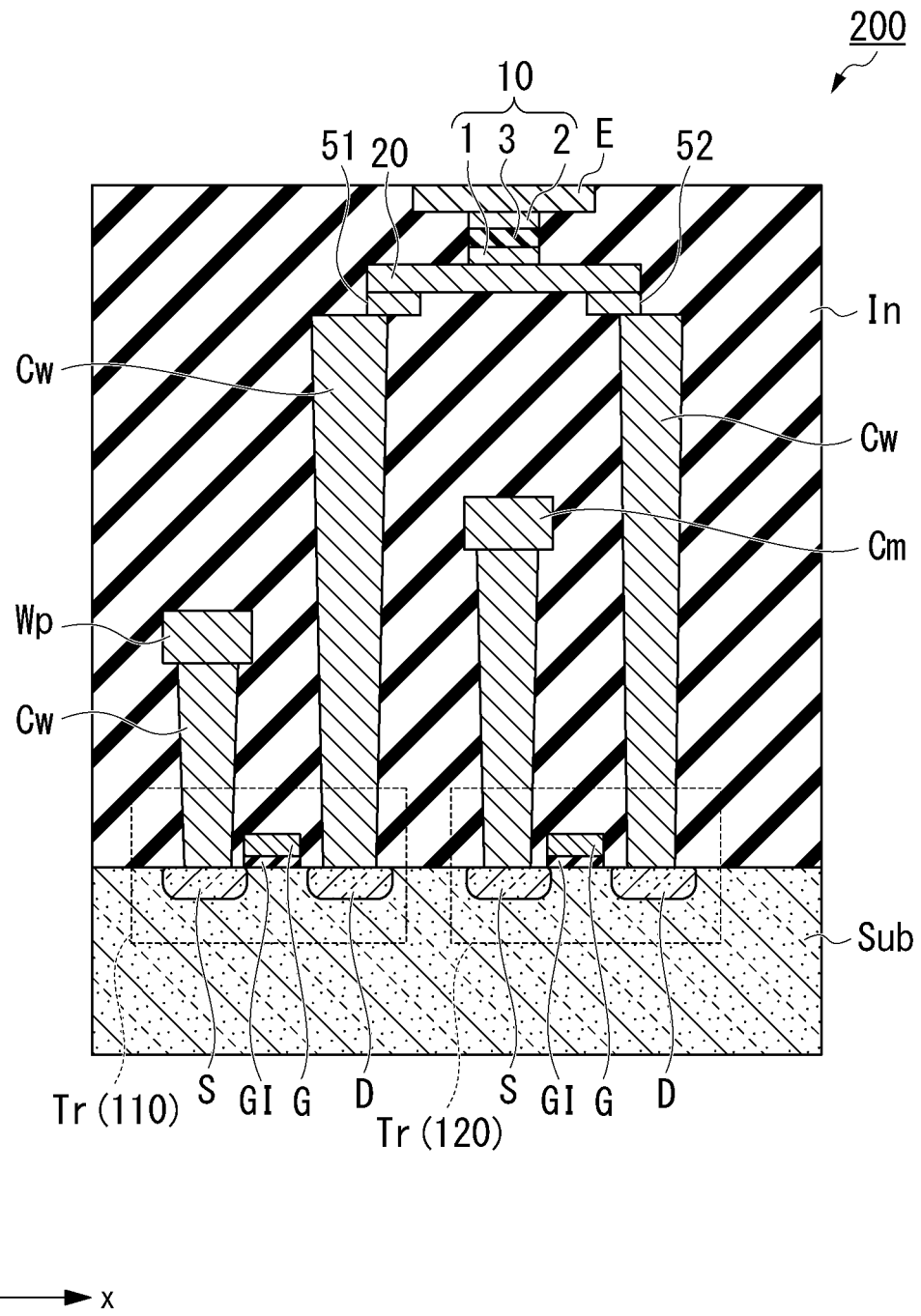
FIG. 2 is a cross-sectional view of the magnetic recording array according to the first embodiment.

FIG. 2 is a cross-sectional view of a characteristic part of the magnetic recording array 200 according to the first embodiment. FIG. 2 is a cross section of the magnetoresistance effect element 100 cut along an xz plane passing through a center of a width of a spin-orbit torque wiring 20 (which will be described below) in the y direction.

The first switching element 110 and the second switching element 120 illustrated in FIG. 2 are transistors Tr. The third switching element 130 is electrically connected to an electrode E and is located at different position in the y direction in FIG. 2, for example. For example, the transistors Tr are field effect transistors and have a gate electrode G, a gate insulating film GI, and a source S and a drain D formed in the substrate Sub. For example, the substrate Sub is a semiconductor substrate.

The transistors Tr and the magnetoresistance effect element 100 are electrically connected to each other via a connection wiring Cw and the conductive parts 51 and 52. In addition, the transistors Tr and the writing wiring Wp or the common wiring Cm are connected to each other through the connection wiring Cw. For example, the connection wiring Cw may be referred to as a via wiring. The connection wiring Cw and the conductive parts 51 and 52 include a material having conductivity. For example, the connection wiring Cw and the conductive parts 51 and 52 extend in the z direction.

Portions around the magnetoresistance effect element 100 and the transistors Tr are covered by an insulating layer In. The insulating layer In is an insulating layer for insulating wirings, such as multilayer wirings, or elements from each other. For example, the insulating layer In is formed of silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), or the like.

Figure 3:
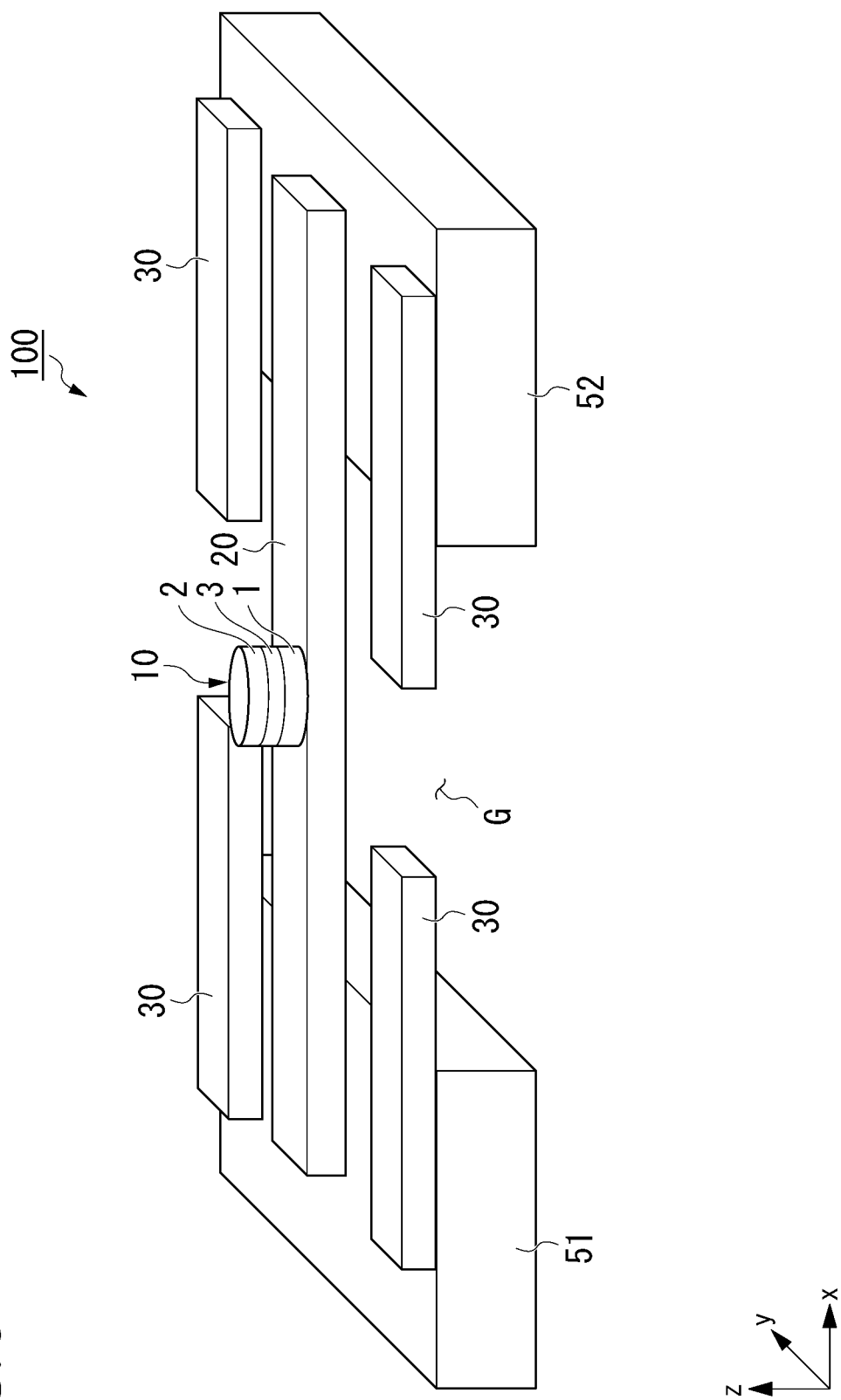
FIG. 3 is a perspective view of a characteristic portion of the magnetic recording array according to the first embodiment.
Figure 4:
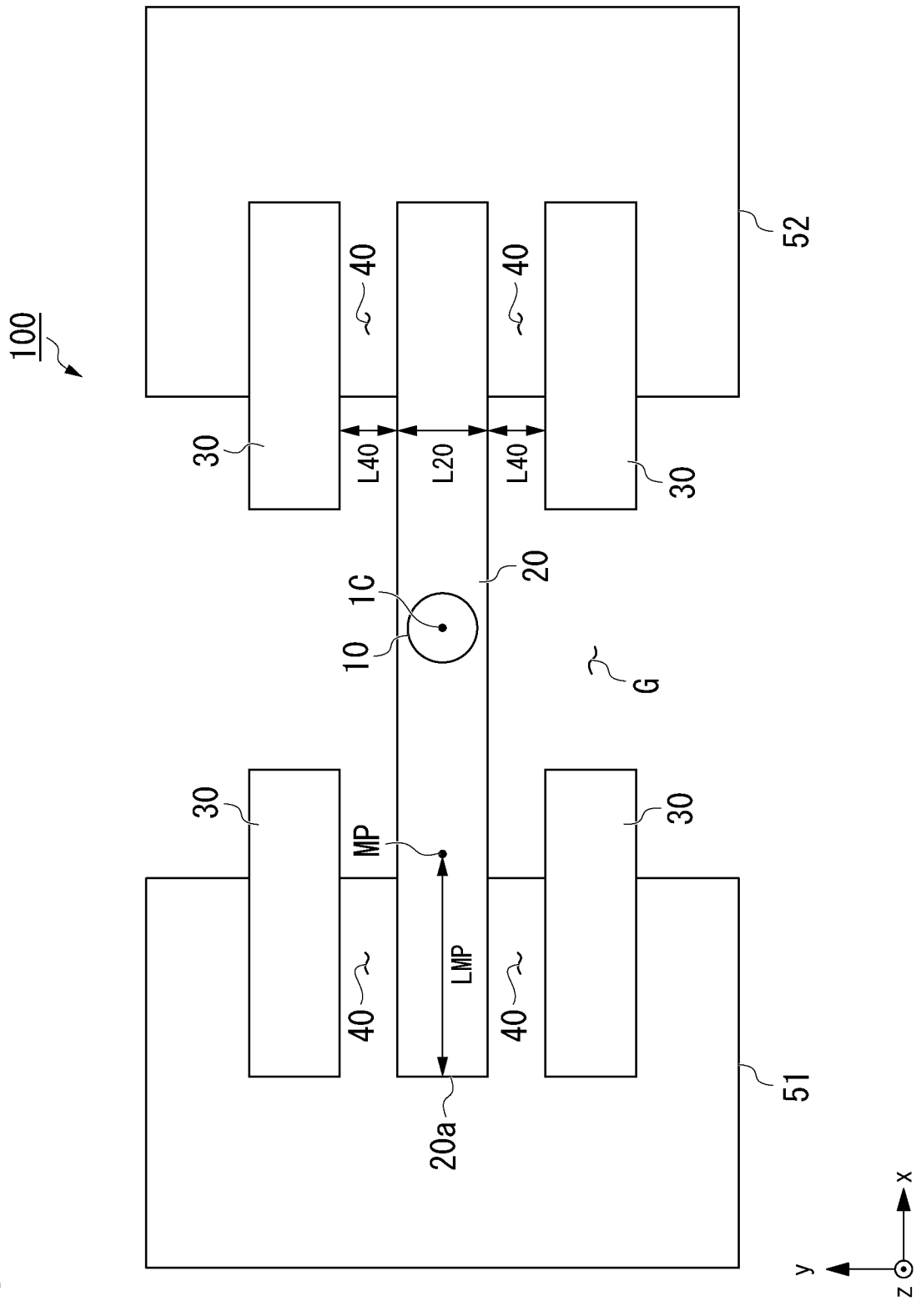
FIG. 4 is a plan view of the characteristic portion of the magnetic recording array according to the first embodiment.
Figure 5:
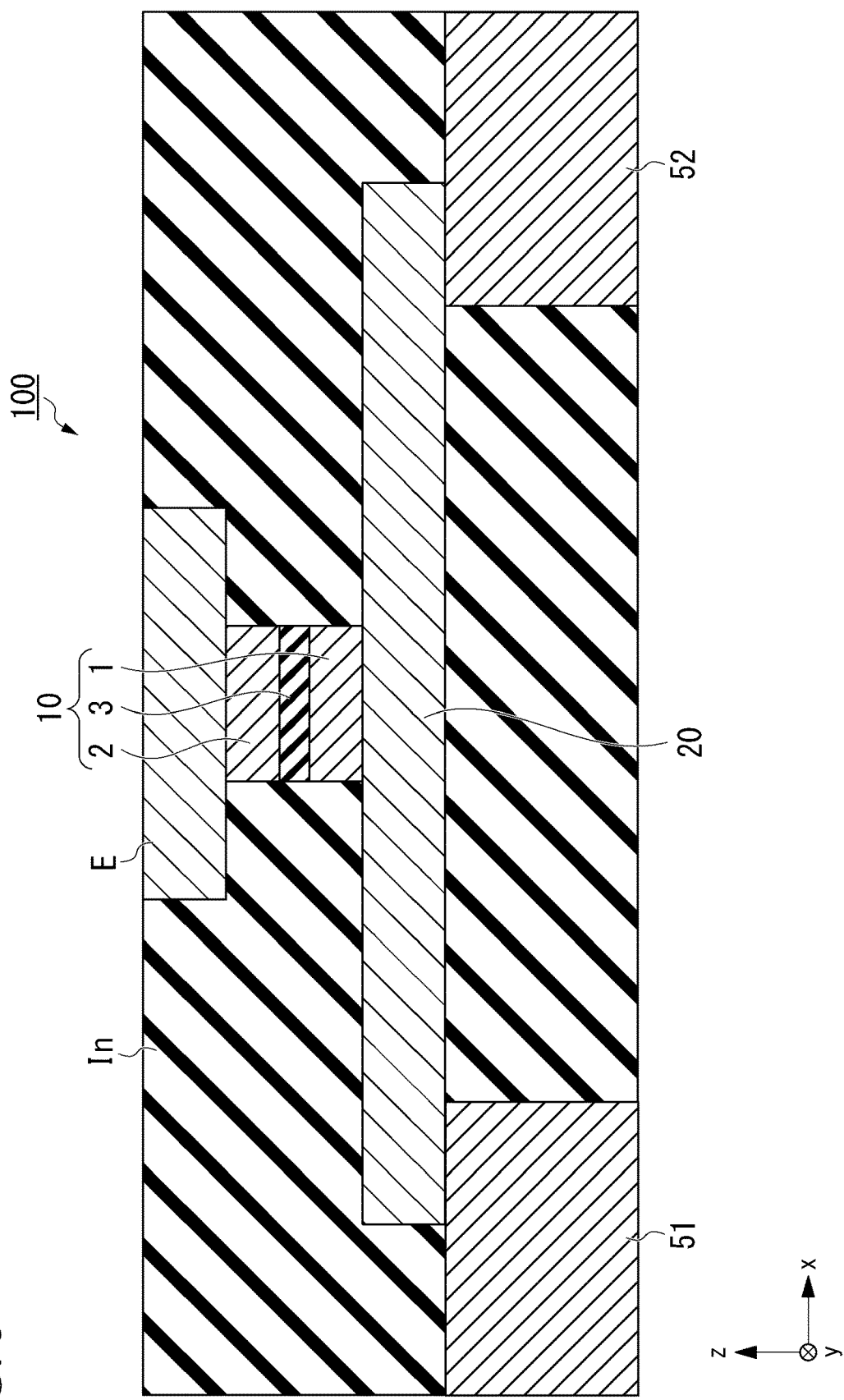
FIG. 5 is a cross-sectional view of the characteristic portion of the magnetic recording array according to the first embodiment.
Figure 6:
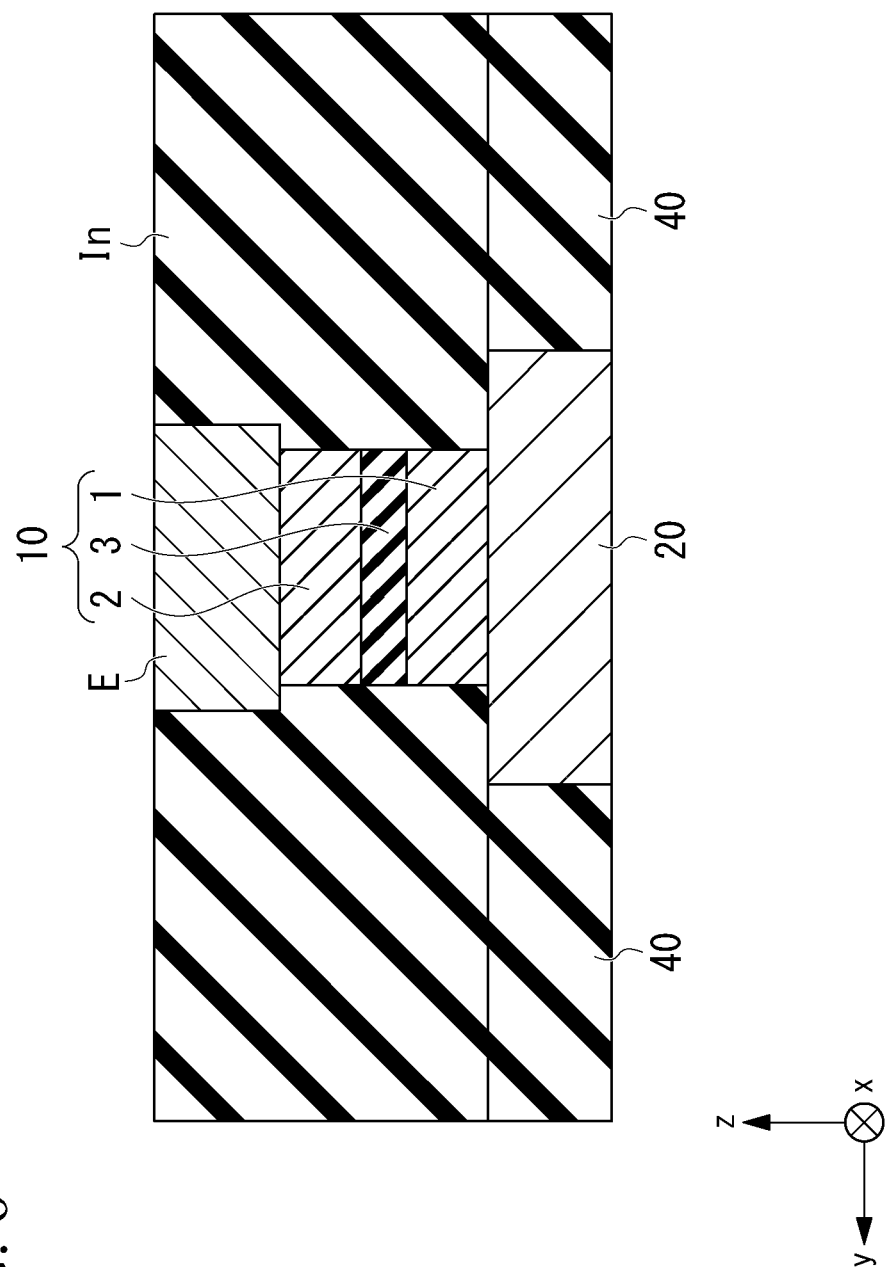
FIG. 6 is another cross-sectional view of the characteristic portion of the magnetic recording array according to the first embodiment.
Figure 7:
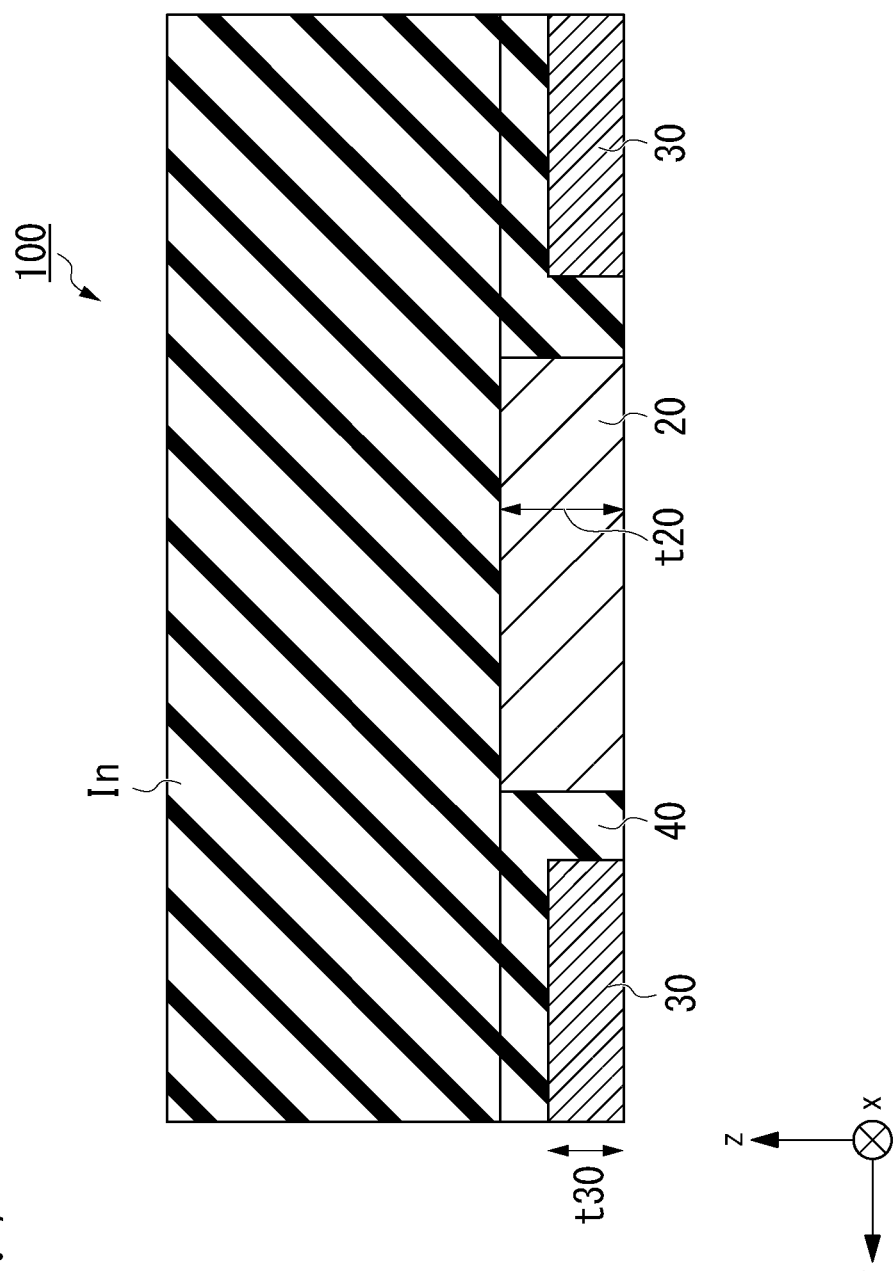
FIG. 7 is another cross-sectional view of the characteristic portion of the magnetic recording array according to the first embodiment.

FIG. 3 is a perspective view of a characteristic portion of the magnetic recording array 200 according to the first embodiment. FIG. 4 is a plan view of the characteristic portion of the magnetic recording array 200 according to the first embodiment in the z direction. FIG. 5 is a cross section of the magnetoresistance effect element 100 cut along the xz plane passing through the center of the width of the spin-orbit torque wiring 20 in the y direction. FIG. 6 is a cross section of the magnetoresistance effect element 100 cut along a yz plane passing through a center of a length of the spin-orbit torque wiring 20 in the x direction. FIG. 7 is a cross section of the magnetoresistance effect element 100 cut along the yz plane passing through the spin-orbit torque wiring 20 and a metal layer 30.

For example, the magnetoresistance effect element 100 includes a laminate 10, the spin-orbit torque wiring 20, the metal layer 30, and the conductive parts 51 and 52. The spin-orbit torque wiring 20 is an example of a spin injection region. The metal layer 30 is an example of a metal region.

A resistance value of the laminate 10 in the z direction varies due to spins injected into the laminate 10 from the spin-orbit torque wiring 20. The magnetoresistance effect element 100 is a magnetic element utilizing a spin-orbit torque (SOT) and may be referred to as a spin-orbit torque magnetoresistance effect element, a spin injection magnetoresistance effect element, or a spin current magnetoresistance effect element.

The laminate 10 is laminated on the spin-orbit torque wiring 20. Another layer may be provided between the laminate 10 and the spin-orbit torque wiring 20. The laminate 10 is interposed between the spin-orbit torque wiring 20 and the electrode E in the z direction. The laminate 10 is a columnar body. The shape of the laminate 10 in a plan view in the z direction is a circular shape, an oval shape, or a quadrangular shape, for example.

The laminate 10 has a first ferromagnetic layer 1, a second ferromagnetic layer 2, and a nonmagnetic layer 3. For example, the first ferromagnetic layer 1 comes into contact with the spin-orbit torque wiring 20 and is laminated on the spin-orbit torque wiring 20. Spins are injected into the first ferromagnetic layer 1 from the spin-orbit torque wiring 20. Regarding magnetization of the first ferromagnetic layer 1, an orientation direction varies when a spin-orbit torque (SOT) is received due to injected spins. The second ferromagnetic layer 2 is above the first ferromagnetic layer 1 in the z direction. The nonmagnetic layer 3 is interposed between the first ferromagnetic layer 1 and the second ferromagnetic layer 2 in the z direction.

Each of the first ferromagnetic layer 1 and the second ferromagnetic layer 2 has magnetization. The orientation direction of the magnetization of the second ferromagnetic layer 2 is less likely to change than that of the magnetization of the first ferromagnetic layer 1 when a predetermined external force is applied. The first ferromagnetic layer 1 may be referred to as a magnetization free layer, and the second ferromagnetic layer 2 may be referred to as a magnetization fixed layer or a magnetization reference layer. The resistance value of the laminate 10 varies in accordance with a difference between relative angles of magnetization of the first ferromagnetic layer 1 and the second ferromagnetic layer 2 having the nonmagnetic layer 3 interposed therebetween.

The first ferromagnetic layer 1 and the second ferromagnetic layer 2 include a ferromagnetic body. For example, the ferromagnetic body is formed of a metal selected from the group consisting of Cr, Mn, Co, Fe and Ni; an alloy including one or more of these metals; an alloy including at least one or more elements of these metals, B, C, and N; or the like. For example, the ferromagnetic body is formed of Co—Fe, Co—Fe—B, Ni—Fe, a Co—Ho alloy, a Sm—Fe alloy, a Fe—Pt alloy, a Co—Pt alloy, or a CoCrPt alloy.

The first ferromagnetic layer 1 and the second ferromagnetic layer 2 may include a Heusler alloy. A Heusler alloy includes an intermetallic compound having a chemical composition of XYZ or $X_2YZ$. X represents a transition metal element or a noble metal element of the Co-group, the Fe-group, the Ni-group, or the Cu-group on the periodic table, Y represents a transition metal of the Mn-group, the V-group, the Cr-group, or the Ti-group or an element represented by X, and Z represents a typical element from Groups III p to V. For example, a Heusler alloy is formed of $Co_2FeSi$, $Co_2FeGe$, $Co_2FeGa$, $Co_2MnSi$, $Co_2Mn_{1-a}FeaAl_bSi_{1-b}$, $Co_2FeGe_{1-c}Ga_c$, or the like. A Heusler alloy has high spin polarization.

The nonmagnetic layer 3 includes a nonmagnetic body. When the nonmagnetic layer 3 is an insulator (when the nonmagnetic layer 3 is a tunnel barrier layer), for example, $Al_2O_3$, $SiO_2$, MgO, $MgAl_2O_4$, or the like can be used as a material thereof. In addition to these, it is also possible to use a material or the like in which a portion of Al, Si, or Mg is replaced with Zn, Be, or the like. Among these, MgO and $MgAl_2O_4$ are materials capable of realizing coherent tunneling, and thus spins can be efficiently injected. When the nonmagnetic layer 3 is a metal, Cu, Au, Ag, or the like can be used as a material thereof. Moreover, when the nonmagnetic layer 3 is a semiconductor, Si, Ge, $CuInSe_2$, $CuGaSe_2$, $Cu(In, Ga)Se_2$, or the like can be used as a material thereof.

The laminate 10 may have an antiferromagnetic layer with a spacer layer therebetween on a surface on a side opposite to the nonmagnetic layer 3 of the second ferromagnetic layer 2. The second ferromagnetic layer 2, the spacer layer, and the antiferromagnetic layer form a synthetic antiferromagnetic structure (SAF structure). The synthetic antiferromagnetic structure is constituted of two magnetic layers having a nonmagnetic layer interposed therebetween. Due to antiferromagnetic coupling of the second ferromagnetic layer 2 and the antiferromagnetic layer, a coercivity of the second ferromagnetic layer 2 increases compared to when the structure has no antiferromagnetic layer. For example, the antiferromagnetic layer is formed of IrMn, PtMn, or the like. For example, the spacer layer includes at least one selected from the group consisting of Ru, Ir, and Rh.

The laminate 10 may have a layer other than the first ferromagnetic layer 1, the second ferromagnetic layer 2, and the nonmagnetic layer 3. For example, an underlayer may be provided between the spin-orbit torque wiring 20 and the laminate 10. An underlayer enhances crystallinity of layers constituting the laminate 10.

For example, the spin-orbit torque wiring 20 comes into contact with a surface of the laminate 10. The spin-orbit torque wiring 20 is an example of a wiring and is a writing wiring for writing data in the magnetoresistance effect element 100. For example, the spin-orbit torque wiring 20 has a longer length in the x direction than that in the y direction when viewed in the z direction and extends in the x direction. In the first embodiment, the x direction is an example of a first direction. The first ferromagnetic layer 1 is interposed between at least a portion of the spin-orbit torque wiring 20 and the nonmagnetic layer 3 in the z direction.

The spin-orbit torque wiring 20 generates a spin current due to a spin Hall effect occurring when a current I flows and injects spins into the first ferromagnetic layer 1. For example, the spin-orbit torque wiring 20 applies a spin-orbit torque (SOT) for magnetization of the first ferromagnetic layer 1 by an amount with which magnetization of the first ferromagnetic layer 1 can be inverted. A spin Hall effect is a phenomenon in which a spin current is induced in a direction orthogonal to a direction in which a current flows based on a spin-orbit interaction when a current is caused to flow. A spin Hall effect is the same as a normal Hall effect in that a moving (traveling) direction of moving (traveling) charges (electrons) is bent. In a normal Hall effect, the moving direction of charged particles moving in a magnetic field is bent due to a Lorentz force. In contrast, in a spin Hall effect, even if no magnetic field is present, the traveling direction of spins is bent simply due to traveling electrons (flowing currents).

For example, if a current flows in the spin-orbit torque wiring 20, each of a first spin oriented in one direction and a second spin oriented in a direction opposite to that of the first spin is bent due to a spin Hall effect in a direction orthogonal to a direction in which the current I flows. For example, the first spin oriented in a negative y direction is bent in the positive z direction, and the second spin oriented in a positive y direction is bent in the negative z direction.

In a nonmagnetic body (a material which is not a ferromagnetic body), the number of electrons in the first spin and the number of electrons in the second spin generated due to a spin Hall effect are equivalent to each other. That is, the number of electrons in the first spin toward the positive z direction and the number of electrons in the second spin toward the negative z direction are equivalent to each other. The first spin and the second spin flow in a direction in which an uneven distribution of the spins is eliminated. In traveling of the first spin and the second spin in the z direction, since flows of charges cancel each other out, a current amount becomes zero. A spin current accompanying no current is particularly referred to as a pure spin current.

When a flow of electrons in the first spin is expressed as $J_\uparrow$, a flow of electrons in the second spin is expressed as $J_\downarrow$, and a spin current is expressed as $J_S$, these are defined by $J_S = J_\uparrow - J_\downarrow$. The spin current $J_S$ is generated in the z direction. The first spin is injected into the first ferromagnetic layer 1 from the spin-orbit torque wiring 20.

The spin-orbit torque wiring 20 includes any of a metal, an alloy, an intermetallic compound, a metal boride, a metal carbide, a metal silicide, and a metal phosphide having a function of generating a spin current due to a spin Hall effect occurring when the current I flows.

For example, the spin-orbit torque wiring 20 includes a nonmagnetic heavy metal as a main component. A heavy metal denotes a metal having a specific gravity greater than that of yttrium (Y). For example, a nonmagnetic heavy metal is a nonmagnetic metal having d electrons or f electrons in an outermost shell and having a large atomic number (the atomic number 39 or larger). For example, the spin-orbit torque wiring 20 is constituted of Hf, Ta, or W. In a nonmagnetic heavy metal, a spin-orbit interaction stronger than that in other metals occurs. A spin Hall effect occurs due to a spin-orbit interaction, spins are likely to be unevenly distributed inside the spin-orbit torque wiring 20, and the spin current $J_S$ is likely to be generated.

For example, the spin-orbit torque wiring 20 includes at least one selected from the group consisting of Ta, W, Pt, Au, Nb, Mo, Ru, Os, Rh, Ir, Pd, and Ag. For example, the spin-orbit torque wiring 20 is constituted of a single metal of these elements. These elements have excellent heat conductivity, and thus heat dissipation properties of the magnetoresistance effect element 100 are improved.

Furthermore, the spin-orbit torque wiring 20 may include a magnetic metal. A magnetic metal is a ferromagnetic metal or an antiferromagnetic metal. A minute amount of a magnetic metal included in a nonmagnetic body may become a scattering factor of spins. For example, a minute amount indicates 3% or smaller than a total mole ratio of an element consisting the spin-orbit torque wiring 20. When spins scatter due to a magnetic metal, a spin-orbit interaction increases, and generation efficiency of a spin current with respect to a current is enhanced.

The spin-orbit torque wiring 20 may include a topological insulator. A topological insulator is formed of a material in which the interior of the material is an insulator or a high-resistance body and a spin-polarized metal state is generated on its surface. An internal magnetic field is generated in a topological insulator due to a spin-orbit interaction. In a topological insulator, a new topological phase develops due to an effect of a spin-orbit interaction even if there is no an external magnetic field. A topological insulator can generate a pure spin current with high efficiency due to a strong spin-orbit interaction and breaking of inversion symmetry at an edge.

For example, a topological insulator is formed of SnTe, $Bi_{1.5}Sb_{0.5}Te_{1.7}Se_{1.3}$, $TiBiSe_2$, $Bi_2Te_3$, $Bi_{1-x}Sb_x$, $(Bi_{1-x}Sb_x)_2Te_3$ or the like. A topological insulator can generate a spin current with high efficiency.

The metal layer 30 is adjacent to the spin-orbit torque wiring 20 with an insulator 40 interposed therebetween in the y direction in a plan view in the z direction. For example, each metal layer 30 extends in the x direction. For example, each metal layer 30 is parallel with the spin-orbit torque wiring 20. The insulator 40 is located between the spin-orbit torque wiring 20 and the metal layer 30.

For example, the metal layer 30 is constituted of a material having more excellent heat conductivity than a material constituting the insulator 40. For example, the metal layer 30 is constituted of the same material as the spin-orbit torque wiring 20.

The insulator 40 may be constituted of a material which is the same as or different from that of the foregoing insulating layer In. For example, the insulator 40 is formed of AlN or MgO.

For example, the metal layer 30 comes into contact with the conductive parts 51 and 52. Since the metal layer 30 and the conductive parts 51 and 52 come into contact with each other, heat dissipation from the metal layer 30 is promoted. There is a gap G between the metal layer 30 which comes into contact with the conductive part 51 and the metal layer 30 which comes into contact with the conductive part 52. No current flows between the conductive parts 51 and 52 via the metal layer 30, and a current flows in the spin-orbit torque wiring 20.

For example, the metal layer 30 is not located at a position in the y direction with respect to the first ferromagnetic layer 1 of the laminate 10. For example, the metal layer 30 is located at a position in the y direction with respect to a middle point MP between a first end 20a and a geometrical center 1C of the first ferromagnetic layer 1. The first end 20a is one end of the spin-orbit torque wiring 20. The laminate 10 and the conductive parts 51 and 52 have a higher heat conductivity than the insulating layer In, and a great part of heat generated in the spin-orbit torque wiring 20 is discharged therethrough. The middle point MP is at a distance from both the laminate 10 and the conductive parts 51 and 52 and is likely to generated heat. Since the metal layer 30 is provided at the position of the middle point MP in the y direction, heat dissipation efficiency of the magnetoresistance effect element 100 is enhanced.

The metal layer 30 is close to the spin-orbit torque wiring 20. For example, a closest distance L40 between the metal layer 30 and the spin-orbit torque wiring 20 is shorter than a distance LMP between the first end 20a and the middle point MP. In addition, for example, the closest distance L40 between the metal layer 30 and the spin-orbit torque wiring 20 is shorter than a distance L20 of the spin-orbit torque wiring 20 in a width direction (y direction). Since the metal layer 30 is sufficiently close to the spin-orbit torque wiring 20, heat dissipation from the metal layer 30 becomes more efficient.

For example, a thickness t30 of the metal layer 30 is thinner than a thickness t20 of the spin-orbit torque wiring 20. For example, an upper surface of the metal layer 30 is below an upper surface of the spin-orbit torque wiring 20. The metal layer 30 is one of propagation paths for heat generated in the spin-orbit torque wiring 20. Since the metal layer 30 is not around the first ferromagnetic layer 1, magnetization of the first ferromagnetic layer 1 is made stable.

The laminate 10 is interposed between the conductive parts 51 and 52 in the x direction in a plan view in the z direction. The conductive parts 51 and conductive part 52 are connection parts between the spin-orbit torque wiring 20 and the connection wiring Cw. For example, the shapes of the conductive parts 51 and 52 in a plan view in the z direction are quadrangular shapes or circular shapes. For example, the conductive parts 51 and 52 are constituted of a material having conductivity.

The electrode E is on a side opposite to the spin-orbit torque wiring 20 of the laminate 10. For example, the electrode E comes into contact with the second ferromagnetic layer 2 of the laminate 10. The electrode E is constituted of a material having conductivity. For example, the electrode E includes any one selected from the group consisting of Al, Cu, Ta, Ti, Zr, NiCr, and nitride (for example, TiN, TaN, or SiN). For example, the electrode E is a laminate of NiCr and Ta. The electrode E may function as a cap layer of the laminate 10. In addition, the electrode E may function as a hard mask used in a step of manufacturing the magnetoresistance effect element 100.

For example, the electrode E may be constituted of a transparent electrode material. For example, the electrode E may be formed of indium zinc oxide (IZO), indium-tin oxide (ITO), tin oxide ($SnO_2$), antimony oxide-tin oxide-based (ATO), zinc oxide (ZnO), fluorine-doped tin oxide (FTO), indium oxide ($In_2O_3$), or the like. If the electrode E is transparent, the orientation direction of magnetization of the first ferromagnetic layer 1 or the second ferromagnetic layer 2 is easily read from outside.

Next, a method for manufacturing the magnetoresistance effect element 100 will be described. The magnetoresistance effect element 100 is formed through a step of laminating layers and a processing step of processing a portion of each layer into a predetermined shape. Each layer can be laminated using a sputtering method, a chemical vapor deposition (CVD) method, an electron beam evaporation method (EB evaporation method), an atom laser deposition method, or the like. Each layer can be processed using photolithography or the like.

First, the source S and the drain D are formed by doping impurities in a predetermined position of the substrate Sub. Next, the gate insulating film GI and the gate electrode G are formed between the source S and the drain D. The source S, the drain D, the gate insulating film GI, and the gate electrode G become the transistors Tr.

Next, the insulating layer In is formed such that the transistors Tr are covered. In addition, the connection wiring Cw, the conductive parts 51 and 52 are formed by forming an opening part in the insulating layer In and filling the inside of the opening part with a conductor. The writing wiring Wp and the common wiring Cm are formed by laminating the insulating layer In up to a predetermined thickness, forming a groove in the insulating layer In thereafter, and filling the groove with a conductor.

Next, a metal layer, a ferromagnetic layer, a nonmagnetic layer, and a ferromagnetic layer are laminated in order on a surface of each of the insulating layer In, the conductive parts 51 and 52. Next, the metal layer is processed into a predetermined shape. The metal layer, which has been processed into a predetermined shape, becomes the spin-orbit torque wiring 20 and the metal layer 30. Next, a laminate formed on the spin-orbit torque wiring 20 is processed into a predetermined shape, and the laminate 10 is obtained. Next, an insulating layer is laminated on the spin-orbit torque wiring 20 and the laminate 10. Next, the electrode E is formed on the laminate 10 and the insulating layer In. Other portions are filled with the insulating layer In, and the magnetoresistance effect element 100 is obtained.

Next, operation of the magnetoresistance effect element 100 according to the first embodiment will be described. The magnetoresistance effect element 100 performs operation of writing data and operation of reading data.

First, operation of recording data in the magnetoresistance effect element 100 will be described. First, the first switching element 110 and the second switching element 120 connected to the magnetoresistance effect element 100 in which data is intended to be recorded are turned on. When the first switching element 110 and the second switching element 120 are turned on, a writing current flows in the spin-orbit torque wiring 20. When a writing current flows in the spin-orbit torque wiring 20, a spin Hall effect occurs, and spins are injected into the first ferromagnetic layer 1. Spins injected into the first ferromagnetic layer 1 apply a spin-orbit torque (SOT) to magnetization of the first ferromagnetic layer 1 and change the orientation direction of magnetization of the first ferromagnetic layer 1. When a flow direction of a current is reversed, the direction of spins injected into the first ferromagnetic layer 1 is reversed, and thus the orientation direction of magnetization can be freely controlled.

The resistance value of the laminate 10 in the lamination direction is small when magnetization of the first ferromagnetic layer 1 and magnetization of the second ferromagnetic layer 2 are parallel to each other, and is large when magnetization of the first ferromagnetic layer 1 and magnetization of the second ferromagnetic layer 2 are anti-parallel to each other. Data is recorded in the magnetoresistance effect element 100 as the resistance value of the laminate 10 in the lamination direction.

Next, operation of reading data from the magnetoresistance effect element 100 will be described. First, the first switching element 110 or the second switching element 120 and the third switching element 130 connected to the magnetoresistance effect element 100 in which data is intended to be recorded are turned on. When each of the switching elements is set in this manner, a reading current flows in the lamination direction of the laminate 10. When the resistance value of the laminate 10 in the lamination direction varies due to the Ohm's law, an output voltage varies. For this reason, for example, data recorded in the magnetoresistance effect element 100 can be read by reading a voltage in the lamination direction of the laminate 10.

The magnetoresistance effect element 100 according to the first embodiment can efficiently remove heat generated in the spin-orbit torque wiring 20 at the time of writing operation and has an excellent stability of data. Hereinafter, a reason therefor will be specifically described.

The spin-orbit torque wiring 20 often includes a heavy metal. A heavy metal has a large electrical resistance and becomes a heat generation source. Heat generated in the spin-orbit torque wiring 20 may deteriorate a stability of magnetization of the magnetoresistance effect element 100 and may cause deterioration in reliability of stored data. A great part of generated heat is discharged to outside through the electrode E and the conductive parts 51 and 52 having excellent heat conductivity. The metal layer 30 is close to the spin-orbit torque wiring 20 and functions as a heat dissipation path. Since heat dissipates via the metal layer 30, heat-exhausting efficiency of the magnetoresistance effect element 100 is enhanced. As a result, the magnetoresistance effect element 100 can stably retain data and has high reliability.

First Modification Example

Figure 8:
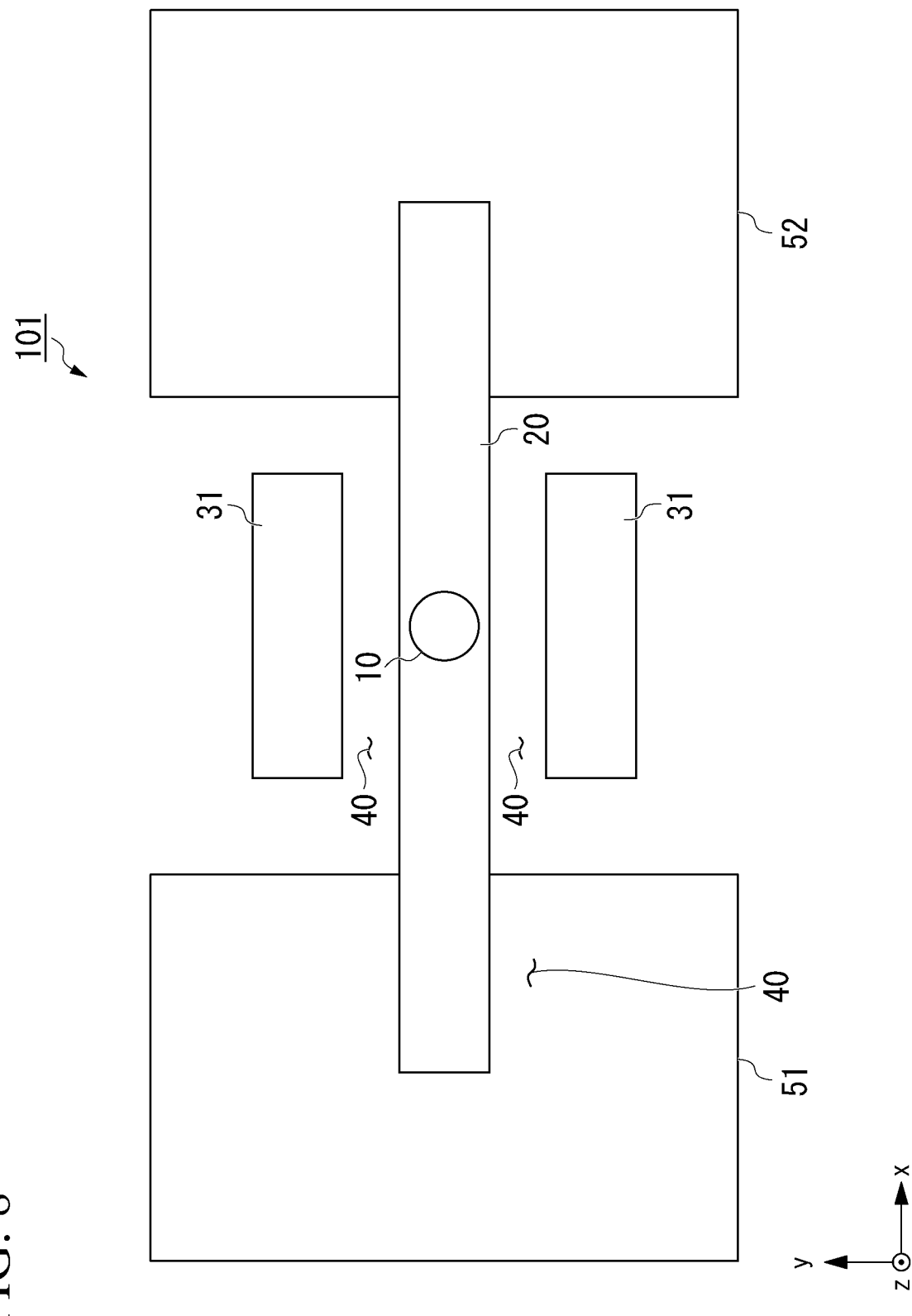
FIG. 8 is a plan view of a characteristic portion of a magnetic recording array according to a first modification example.

FIG. 8 is a plan view of a characteristic portion of a magnetic recording array according to a first modification example. In the magnetic recording array according to the first modification example, the position of a metal layer 31 in a magnetoresistance effect element 101 differs from that in the magnetoresistance effect element 100 illustrated in FIG. 4. In FIG. 8, the same reference signs are applied to constituents similar to those in FIG. 4, and description thereof will be omitted.

For example, the metal layer 31 differs from the metal layer 30 described above in being located at a position in the y direction with respect to the first ferromagnetic layer 1 of the laminate 10.

In addition, for example, the metal layer 31 does not come into contact with the conductive parts 51 and 52. The metal layer 31 is electrically insulated from other constituents. When the metal layer 31 comes into contact with the conductive parts 51 and 52, the metal layer 31 becomes an electrostatic capacity with respect to the spin-orbit torque wiring 20. When the electrostatic capacity electrically connected to the spin-orbit torque wiring 20 is reduced, a response to a pulse current for writing becomes fast.

The material of the metal layer 31 and other constituents are similar to those of the metal layer 30 described above.

Since the magnetic recording array according to the first modification example has the metal layer 31 close to the spin-orbit torque wiring 20, it is possible to achieve effects similar to those of the magnetic recording array 200 according to the first embodiment.

Second Modification Example

Figure 9:
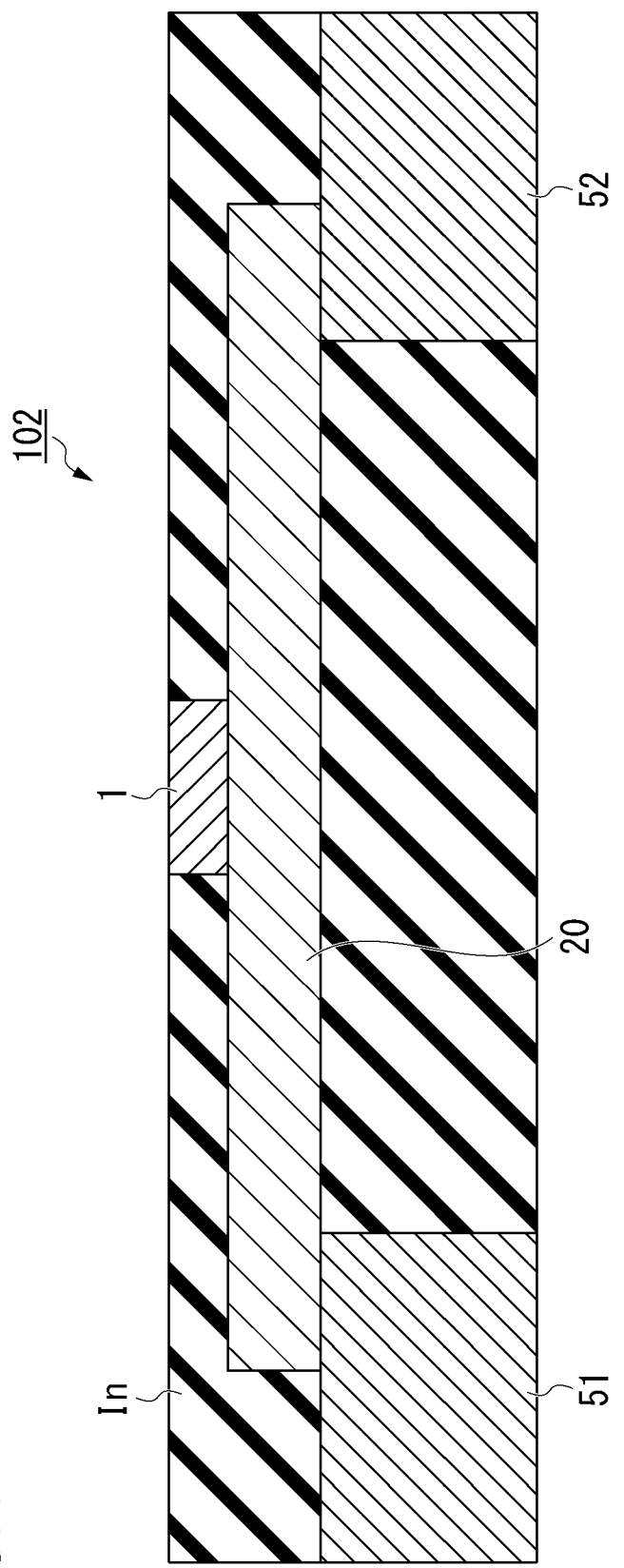
FIG. 9 is a cross-sectional view of a magnetization rotational element according to a second modification example.

FIG. 9 is a cross-sectional view of a magnetization rotational element 102 according to a second modification example. FIG. 9 is a cross section of the magnetization rotational element 102 cut along an xz plane passing through the center of the width of the spin-orbit torque wiring 20 in the y direction. The magnetization rotational element 102 according to the second modification example differs from that in the magnetoresistance effect element 100 according to the first embodiment in that the nonmagnetic layer 3 and the second ferromagnetic layer 2 are not provided. Other constituents are similar to those of the magnetoresistance effect element 100 according to the first embodiment, and description thereof will be omitted.

The magnetization rotational element 102 is an example of a spin element. For example, the magnetization rotational element 102 causes light to be incident on the first ferromagnetic layer 1 and evaluates light reflected by the first ferromagnetic layer 1. When the orientation direction of magnetization varies due to a magnetic Kerr effect, a deflection state of reflected light varies. For example, the magnetization rotational element 102 can be used, for example, as an optical element such as a graphic display device utilizing a difference between deflection states of light.

Furthermore, the magnetization rotational element 102 can also be utilized alone as an anisotropy magnetic sensor, an optical element utilizing a magnetic Faraday effect, or the like.

The nonmagnetic layer 3 and the second ferromagnetic layer 2 are simply excluded from the magnetization rotational element 102 according to the second modification example, and it is possible to achieve effects similar to those of the magnetoresistance effect element 100 according to the first embodiment.

Second Embodiment

Figure 10:
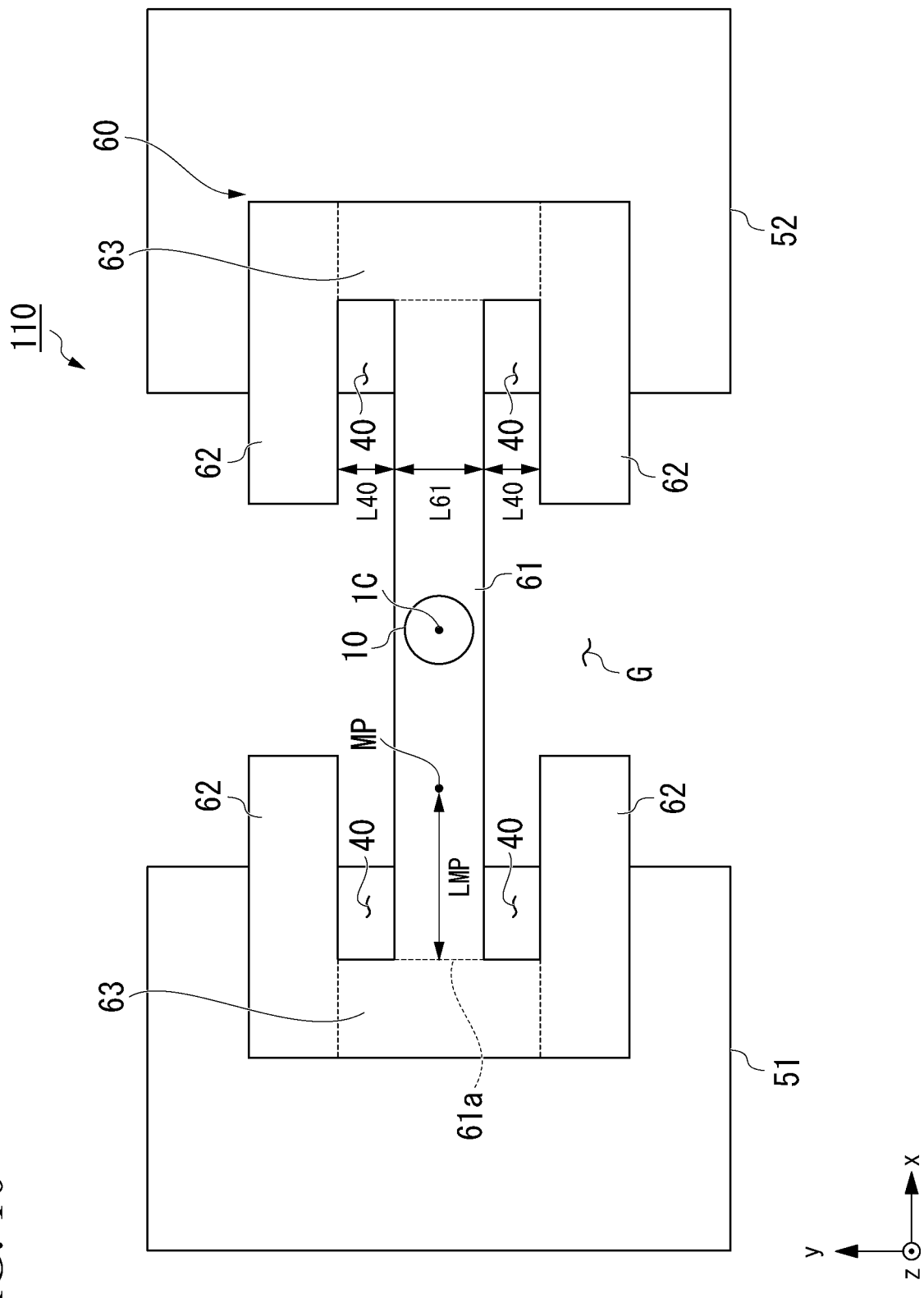
FIG. 10 is a plan view of a characteristic portion of a magnetic recording array according to a second embodiment.

FIG. 10 is a plan view of a characteristic portion of a magnetic recording array according to a second embodiment. For example, a magnetoresistance effect element 110 of the magnetic recording array according to the second embodiment includes the laminate 10, a spin-orbit torque wiring 60, and the conductive parts 51 and 52. In FIG. 10, the same reference signs are applied to constituents similar to those in FIG. 4, and description thereof will be omitted.

The spin-orbit torque wiring 60 has a spin injection region 61, metal regions 62, and a connection region 63. A writing current flowing in the magnetoresistance effect element 110 flows in the spin injection region 61. The spin-orbit torque wiring 60 is constituted of a material similar to that of the spin-orbit torque wiring 20 described above.

For example, the spin injection region 61 comes into contact with a surface of the laminate 10. The spin injection region 61 injects spins generated due to a spin Hall effect into the laminate 10. The spin injection region 61 is a writing wiring for writing data in the magnetoresistance effect element 100. The spin injection region 61 extends in the x direction. For example, the spin injection region 61 has a substantially uniform distance in the width direction.

The metal region 62 is adjacent to the spin injection region 61 with the insulator 40 interposed therebetween in the y direction in a plan view in the z direction. For example, each metal region 62 extends in the x direction. For example, each metal region 62 is parallel to the spin injection region 61. The insulator 40 is located between the spin injection region 61 and the metal region 62.

For example, the metal regions 62 come into contact with the conductive parts 51 and 52. The conductive parts 51 and 52 are conductive parts for applying a current to the spin injection region 61. There is the gap G between the metal region 62 which comes into contact with the conductive part 51 and the metal region 62 which comes into contact with the conductive part 52.

For example, the metal regions 62 are not located at positions in the y direction with respect to the first ferromagnetic layer 1 of the laminate 10. For example, the metal regions 62 are located at positions in the y direction with respect to the middle point MP between a first end 61a and the geometrical center 1C of the first ferromagnetic layer 1. The first end 61a is a boundary between the metal regions 62 and the connection region 63. For example, the closest distance L40 between the metal region 62 and the spin injection region 61 is shorter than the distance LMP between the first end 20a and the middle point MP. In addition, for example, the closest distance L40 between the metal region 62 and the spin injection region 61 is shorter than a distance L61 of the spin injection region 61 in the width direction.

The connection region 63 is a connection portion between the spin injection region 61 and the metal regions 62. The connection region 63 intersects the spin injection region 61 and the metal regions 62. A boundary between the spin injection region 61 and the connection region 63 is a portion in which the distance in the width direction starts to change. Whether or not the distance in the width direction has started to change is determined depending on whether or not the distance in the width direction has changed by 10% or more.

Since the magnetic recording array according to the second embodiment has the metal regions 62 close to the spin injection region 61, it is possible to achieve effects similar to those of the magnetic recording array 200 according to the first embodiment.

Third Modification Example

Figure 11:
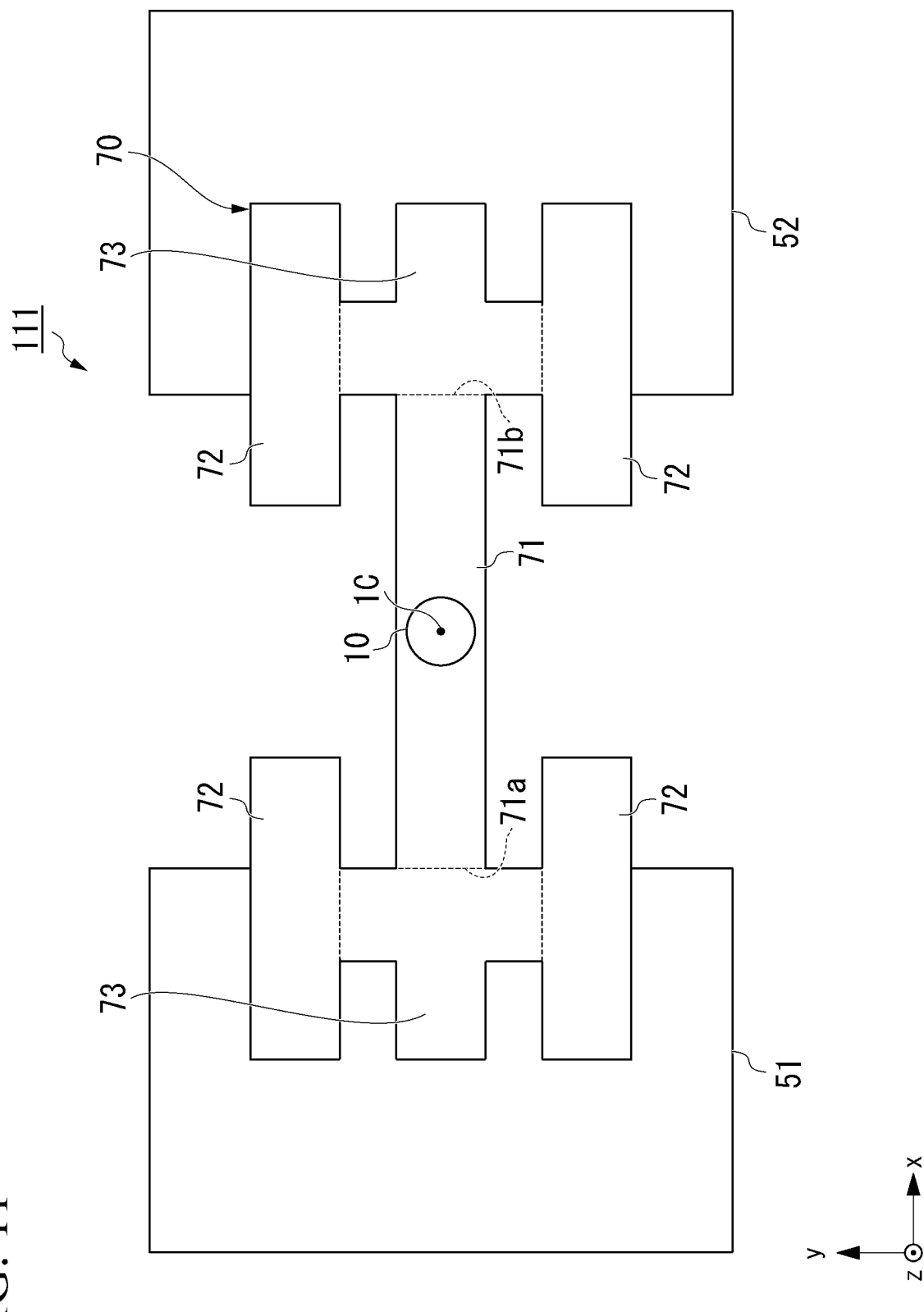
FIG. 11 is a plan view of a characteristic portion of a magnetic recording array according to a third modification example.

FIG. 11 is a plan view of a characteristic portion of a magnetic recording array according to a third modification example. In the magnetic recording array according to the third modification example, the shape of a connection region 73 in a magnetoresistance effect element 111 differs from that in the magnetoresistance effect element 110 illustrated in FIG. 10. In FIG. 11, the same reference signs are applied to constituents similar to those in FIG. 10, and description thereof will be omitted.

A spin-orbit torque wiring 70 has a spin injection region 71, metal region 72, and the connection region 73. The spin-orbit torque wiring 70 differs from the spin-orbit torque wiring 60 in a connection place of the connection region 73. Other constituents are similar to those of the spin-orbit torque wiring 60 described above. The connection region 73 is connected to a portion between the metal regions 72 in the x direction.

Since the magnetic recording array according to the third modification example has the metal regions 72 close to the spin injection region 71, it is possible to achieve effects similar to those of the magnetic recording array according to the second embodiment.

In addition, also in the second embodiment, similar to the second modification example, a magnetization rotational element in which the nonmagnetic layer 3 and the second ferromagnetic layer 2 of the magnetoresistance effect elements 110 and 111 are excluded may be adopted.

Third Embodiment

Figure 12:
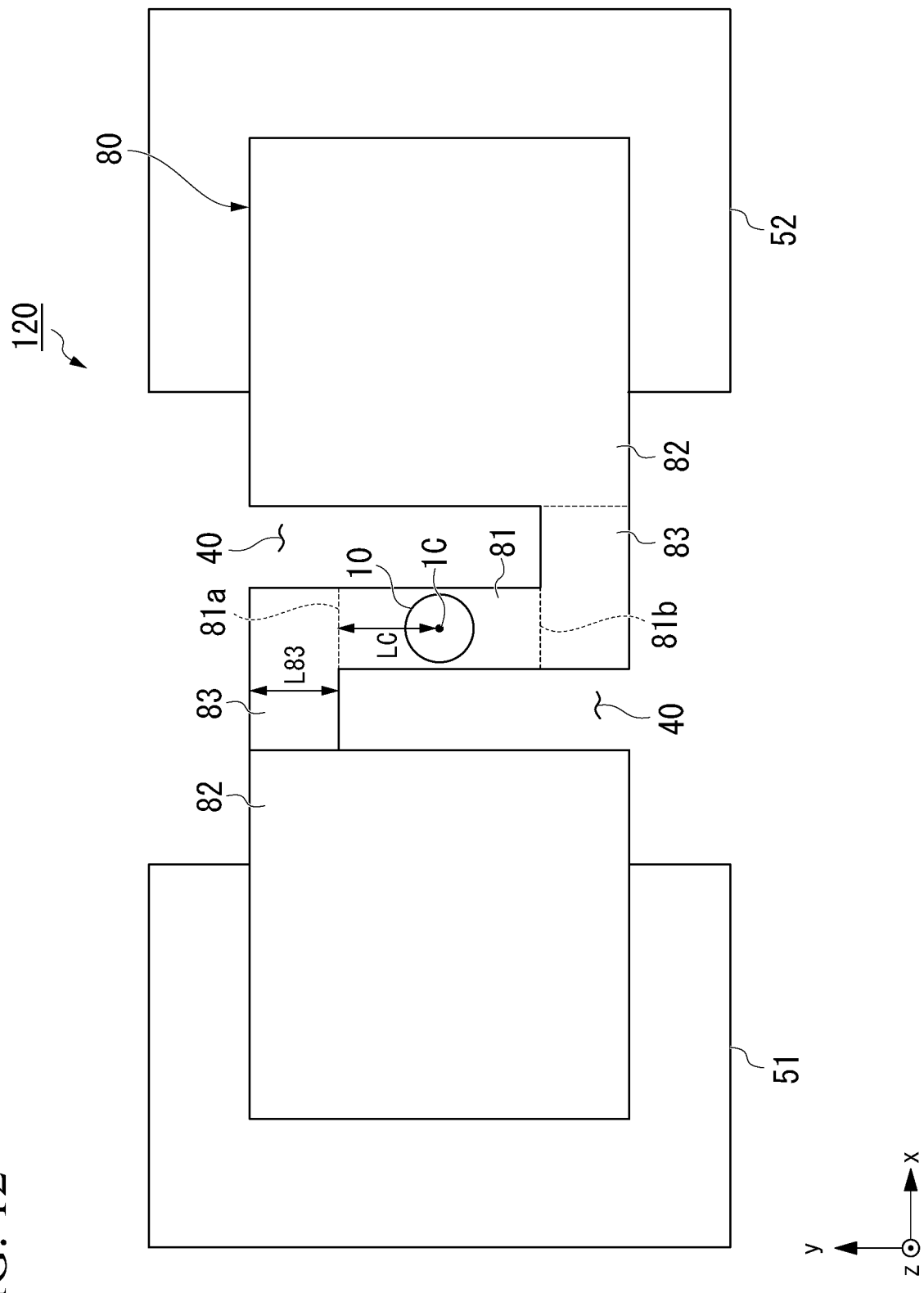
FIG. 12 is a plan view of a characteristic portion of a magnetic recording array according to a third embodiment.

FIG. 12 is a plan view of a characteristic portion of a magnetic recording array according to a third embodiment. A magnetoresistance effect element 120 of the magnetic recording array according to the third embodiment includes the laminate 10, a spin-orbit torque wiring 80, and the conductive parts 51 and 52, for example. In FIG. 12, the same reference signs are applied to constituents similar to those in FIG. 10, and description thereof will be omitted.

The spin-orbit torque wiring 80 has a spin injection region 81, metal regions 82, and connection regions 83. A writing current flowing in the spin-orbit torque wiring 80 flows in the metal regions 82, the connection regions 83, and the spin injection region 81. The spin-orbit torque wiring 80 is constituted of a material similar to that of the spin-orbit torque wiring 20 described above.

For example, the spin injection region 81 comes into contact with a surface of the laminate 10. The spin injection region 81 injects spins generated due to a spin Hall effect into the laminate 10. The spin injection region 81 is a writing wiring for writing data in the magnetoresistance effect element 100. The spin injection region 81 extends in the y direction. In FIG. 12, the y direction is an example of the first direction. For example, the spin injection region 81 has a substantially uniform distance in the width direction.

The metal region 82 is adjacent to the spin injection region 81 with the insulator 40 interposed therebetween in the x direction in a plan view in the z direction.

For example, a closest distance between the metal region 82 and the spin injection region 81 is shorter than a distance between a first end 81a and a middle point. In addition, for example, the closest distance between the metal region 82 and the spin injection region 81 is shorter than the distance of the spin injection region 81 in the width direction.

The connection region 83 is a connection portion between the spin injection region 81 and the metal region 82. The connection region 83 intersects the spin injection region 81 and the metal region 82. A boundary between the spin injection region 81 and the connection region 83 is a portion in which the distance in the width direction starts to change. For example, a distance LC between the first end 81a of the spin injection region 81 and the geometrical center 1C of the first ferromagnetic layer 1 is longer than a length L83 of the connection region 83 in the width direction. When the distance LC is longer than the length L83, a path for heat leading from the laminate 10 to the conductive parts 51 and 52 becomes long, and heat is likely to be accumulated in the spin-orbit torque wiring 80. Due to heat dissipation of the metal regions 82, heat-exhausting efficiency of the magnetoresistance effect element 120 is enhanced.

Since the magnetic recording array according to the third embodiment has the metal regions 82 close to the spin injection region 81, it is possible to achieve effects similar to those of the magnetic recording array 200 according to the first embodiment.

Fourth Modification Example

Figure 13:
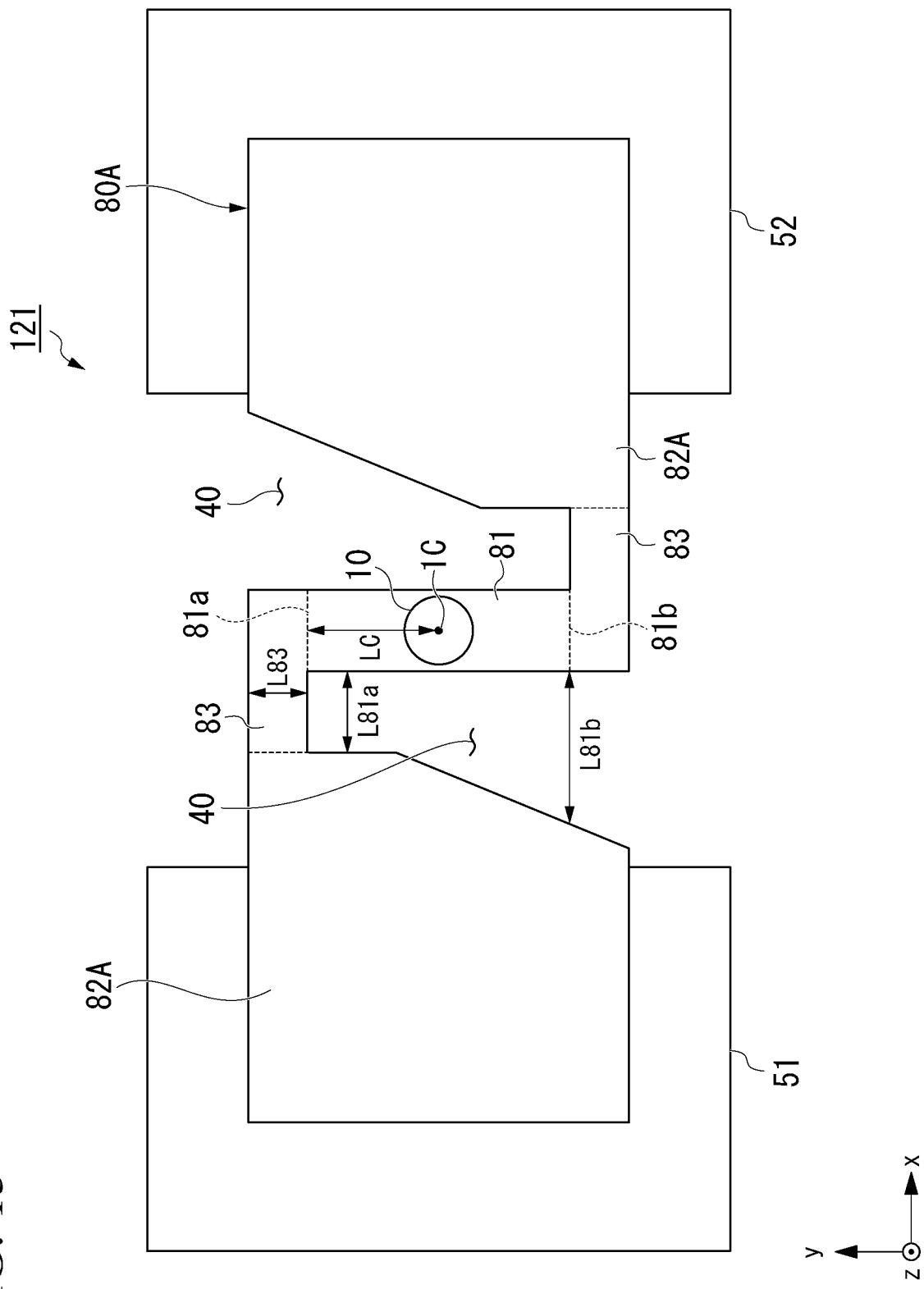
FIG. 13 is a plan view of a characteristic portion of a magnetic recording array according to a fourth modification example.

FIG. 13 is a plan view of a characteristic portion of a magnetic recording array according to a fourth modification example. In the magnetic recording array according to the fourth modification example, the shape of a metal region 82A in a magnetoresistance effect element 121 differs from that in the magnetoresistance effect element 120 illustrated in FIG. 12. In FIG. 13, the same reference signs are applied to constituents similar to those in FIG. 12, and description thereof will be omitted.

A spin-orbit torque wiring 80A has the spin injection region 81, the metal regions 82A, the connection regions 83. A writing current flowing in the spin-orbit torque wiring 80A flows in the metal regions 82A, the connection regions 83, and the spin injection region 81.

A distance L81a between the spin injection region 81 and the metal region 82A in the first end 81a of the spin injection region 81 differs from a distance L81b between the spin injection region 81 and the metal region 82A at a second end 81b of the spin injection region 81. For example, the distance between the spin injection region 81 and the metal region 82A increases as they go away from the connection region 83. The magnetoresistance effect element 121 can be easily manufactured by changing the distance between the spin injection region 81 and the metal region 82A.

Since the magnetic recording array according to the fourth modification example has the metal regions 82A close to the spin injection region 81, it is possible to achieve effects similar to those of the magnetic recording array according to the third embodiment.

Fifth Modification Example

Figure 14:
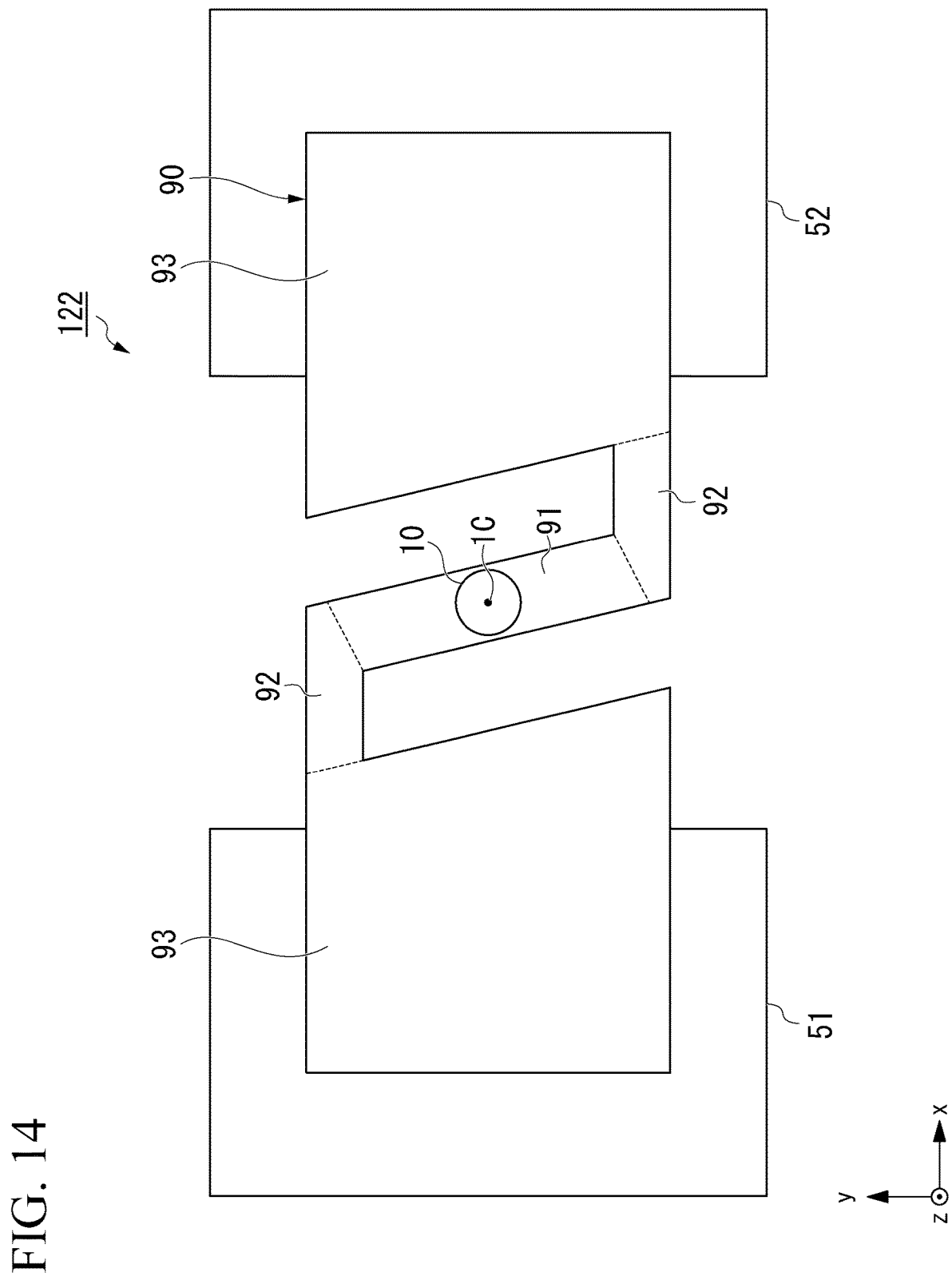
FIG. 14 is a plan view of a characteristic portion of a magnetic recording array according to a fifth modification example.

FIG. 14 is a plan view of a characteristic portion of a magnetic recording array according to a fifth modification example. In the magnetic recording array according to the fifth modification example, the shape of a spin-orbit torque wiring 90 in a magnetoresistance effect element 122 differs from that of the magnetoresistance effect element 120 illustrated in FIG. 12. In FIG. 14, the same reference signs are applied to constituents similar to those in FIG. 12, and description thereof will be omitted.

The spin-orbit torque wiring 90 has a spin injection region 91, metal regions 92, and connection regions 93. A writing current flowing in the spin-orbit torque wiring 90 flows in the metal regions 92, the connection regions 93, and the spin injection region 91. In the spin-orbit torque wiring 90, the spin injection region 91 is inclined with respect to the x direction and the y direction.

Since the magnetic recording array according to the fifth modification example has the metal regions 92 close to the spin injection region 91, it is possible to achieve effects similar to those of the magnetic recording array according to the third embodiment.

In addition, also in the third embodiment, similar to the second modification example, a magnetization rotational element in which the nonmagnetic layer 3 and the second ferromagnetic layer 2 of the magnetoresistance effect elements 110 and 111 are excluded may be adopted.

Thus far, favorable aspects of the present invention have been described as examples on the basis of the first embodiment to the third embodiment, but the present invention is not limited to these embodiments. For example, characteristic constituents in each of the embodiments may be applied to other embodiments.

EXPLANATION OF REFERENCES

1 First ferromagnetic layer
1C Geometrical center
2 Second ferromagnetic layer
3 Nonmagnetic layer
10 Magnetoresistance effect element
20a, 61a, 81a First end
81b Second end
40 Insulator
51, 52 Conductive part
61, 71, 81, 91 Spin injection region
62, 72, 82, 82A, 92 Metal region
63, 73, 83, 93 Connection region 100, 101, 110, 111, 120, 121, 122 Magnetoresistance effect element
L20, L81a, L81b, LC, LMP Distance
L40 Closest distance
MP Middle point

What is claimed is:

1. A magnetization rotational element comprising:
a spin injection region that extends in a first direction;
a first ferromagnetic layer that is laminated on the spin injection region; and
a metal region that is adjacent to the spin injection region with an insulator interposed therebetween in a second direction orthogonal to the first direction in a plan view in a lamination direction in the same layer as the layer where the spin injection region spreads,
wherein the metal region is not in direct contact with a magnetic layer, and
wherein the metal region is not located at a position in the second direction of the portion of the spin injection region that is in direct contact with the first ferromagnetic layer, as viewed from a +z direction or a −z direction of the first ferromagnetic layer.

2. The magnetization rotational element according to claim 1 further comprising:
a connection region that directly connects the spin injection region and the metal region to each other.

3. The magnetization rotational element according to claim 2, wherein a distance between a first end of the spin injection region and a geometrical center of the first ferromagnetic layer is longer than a length of the connection region in a width direction.

4. The magnetization rotational element according to claim 1, wherein a closest distance between the spin injection region and the metal region is shorter than a distance between a first end of the spin injection region and a middle point between the first end and a geometrical center of the first ferromagnetic layer.

5. The magnetization rotational element according to claim 1, wherein a closest distance between the spin injection region and the metal region is shorter than a length of the spin injection region in the second direction.

6. The magnetization rotational element according to claim 1, wherein a distance between the spin injection region and the metal region at the first end of the spin injection region differs from a distance between the spin injection region and the metal region at a second end of the spin injection region.

7. The magnetization rotational element according to claim 1, wherein the spin injection region includes at least one selected from the group consisting of Ta, W, Pt, Au, Nb, Mo, Ru, Os, Rh, Ir, Pd, and Ag.

8. The magnetization rotational element according to claim 1, wherein the insulator is AlN or MgO.

9. The magnetization rotational element according to claim 1, wherein the metal region comes into contact with a conductive part applying a current to the spin injection region.

10. The magnetization rotational element according to claim 1, wherein the metal region does not come into contact with a conductive part applying a current to the spin injection region.

11. The magnetization rotational element according to claim 1, wherein a thickness of the metal region is thinner than a thickness of the spin injection region.

12. The magnetization rotational element according to claim 1, wherein the metal region is not at a position of the first ferromagnetic layer in the second direction.

13. A magnetoresistance effect element comprising:
the magnetization rotational element according to claim 1; and
a nonmagnetic layer and a second ferromagnetic layer that are laminated on the first ferromagnetic layer.

14. A magnetic memory comprising:
a plurality of magnetoresistance effect elements according to claim 13.

15. A magnetization rotational element comprising:
a spin injection region that extends in a first direction;
a first ferromagnetic layer that is laminated on the spin injection region;
a metal region that is adjacent to the spin injection region with an insulator interposed therebetween in a second direction orthogonal to the first direction in a plan view in a +z direction or a −z direction in the same layer as the layer where the spin injection region spreads; and
a first conductive part, a second conductive part and a second metal region, wherein:
the metal region is not in direct contact with a magnetic layer, and
the first conductive part directly contacts a first end of the spin injection region and the metal region,
the second conductive part directly contacts a second end opposite the first end of the spin injection region and the second metal region, and
there is a gap between the metal region and the second metal region.

16. A magnetization rotational element comprising:
a spin injection region that extends in a first direction;
a first ferromagnetic layer that is laminated on the spin injection region; and
a metal region that is adjacent to the spin injection region with an insulator interposed therebetween in a second direction orthogonal to the first direction in a plan view in a +z direction or a −z direction in the same layer as the layer where the spin injection region spreads,
wherein the metal region is not in direct contact with a magnetic layer, and
wherein the metal region is not electrically connected to the spin injection region.

* * * * *